(12) United States Patent
Shackleford et al.

(10) Patent No.: US 6,904,114 B2
(45) Date of Patent: Jun. 7, 2005

(54) ONES COUNTER EMPLOYING TWO DIMENSIONAL CELLULAR ARRAY

(75) Inventors: J. Barry Shackleford, 114 Pecora Way, Portola Valley, CA (US) 94028-7435; David Kent Cullers, Menlo Park, CA (US)

(73) Assignee: J. Barry Shackleford, Portola Valley, CA (US)

( * ) Notice: Subject to any disclaimer, the term of this patent is extended or adjusted under 35 U.S.C. 154(b) by 123 days.

(21) Appl. No.: 10/423,458

(22) Filed: Apr. 25, 2003

(65) Prior Publication Data

US 2004/0223580 A1 Nov. 11, 2004

(51) Int. Cl.⁷ .............................................. H03K 21/00
(52) U.S. Cl. ............................... 377/40; 377/6; 377/16; 377/49
(58) Field of Search ................................. 377/40, 6, 16, 377/49

(56) References Cited

U.S. PATENT DOCUMENTS 3,711,692 A * 1/1973 Batcher ...................... 708/210

* cited by examiner

*Primary Examiner*—Margaret R. Wambach

(57) ABSTRACT

A ones counter that accepts a binary input word of ones and zeros and provides a binary output word indicative of the number of ones within the input word. A two-dimensional array is built with a plurality of like cells connected in a regular manner with the first row of the array determining the least significant bit of the output word and each subsequent row determining the output word's next most significant bit. The first row of the array contains approximately one-half the number of cells as bits in the input word with each subsequent row of the array containing approximately one-half the number of cells of the preceding row with the final row containing a single cell that determines the most significant bit of the binary output word. The ones-count output word is computed asynchronously without clocking circuits or data storage elements.

3 Claims, 5 Drawing Sheets

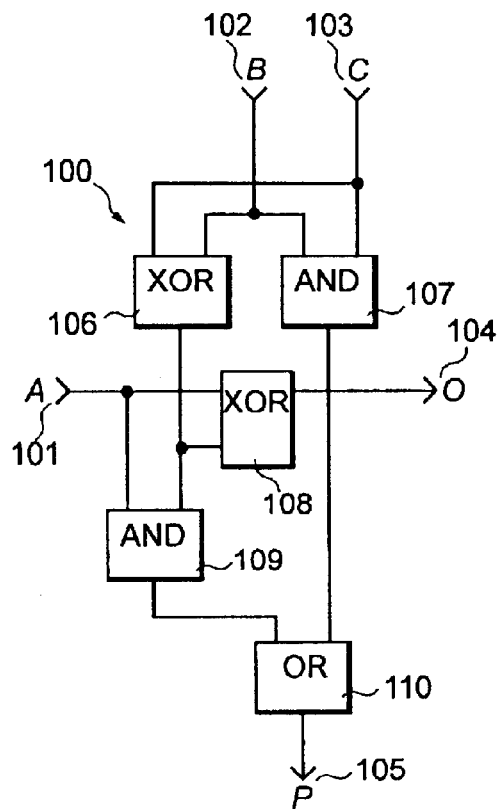
FIG. 3A
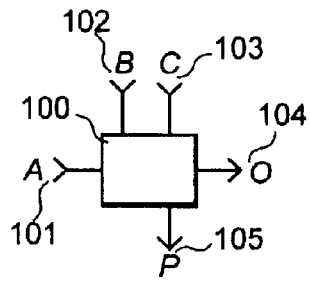
FIG. 3B
```
   101 102 103 104 105
    A B C   O P
    0 0 0   0 0
    0 0 1   1 0
    0 1 0   1 0
    0 1 1   0 1
    1 0 0   1 0
    1 0 1   0 1
    1 1 0   0 1
    1 1 1   1 1
                  −106
```
FIG. 3C

ONES COUNTER EMPLOYING TWO DIMENSIONAL CELLULAR ARRAY

BACKGROUND OF THE INVENTION

The present invention refers to a ones counter. More particularly, the present invention relates to an asynchronous ones counter employing a two-dimensional, regular array of like cells. Here, a two-dimensional array is defined as a physical arrangement of cells and their interconnections such that all interconnections between cells can be made without the necessity of interconnections overlapping or crossing over one another. For example, even though the flat printed wires of a printed circuit board are three-dimensional because they have thickness, their flat surfaces that are bonded to the surface of the printed circuit board form a two-dimensional surface of interconnection. If the arrangement of interconnections is such that it is necessary for a wire to cross over another in order to make a connection then the physical arrangement of components and wires is not two-dimensional because the wire must leave the plane of interconnection.

As shown in FIG. 1A, the function of a ones counter is to accept as its input a binary vector consisting of a plurality of N single-bit, binary-level lines whose individual values may be either one or zero and then provide as its output, a ones count word of $\lfloor (\log_2 N)+1 \rfloor$ bits that indicates the number of input lines that have a level of one. Considering the example shown in FIG. 1B, the binary vector input (1, 0, 1, 1, 1, 1, 0, 1, 1, 1, 0, 1, 0, 1, 1, 0) has sixteen individual bits, eleven of which are ones. Thus, N is 16 and the base-2 logarithm of 16 is 4.0 and 4.0+1 rounded down by the floor function $\lfloor \ \rfloor$ becomes the integer 5, the bit width of the ones count output word whose value is $01011_2$ which is the binary notation for eleven, the number of ones in the input binary vector.

A typical application of a ones counter is exemplified in U.S. Pat. No. 5,761,077 by Shackleford entitled "Graph Partitioning Engine Based on Programmable Gate Arrays" wherein the partition state of a bipartitioned graph is contained within a binary vector where each bit represents the partition state of a vertex in the graph. Each bit can either be a binary one or zero, reflecting the partition assignment of the associated vertex. By counting the number of ones in the partition state vector, the relative balance of vertices between the two partitions can be readily determined. The relative balance of vertices is an important factor in determining a figure of merit for the trial partition expressed in the partition state vector. Since many trial partitions must be tested before obtaining an optimum partition, it is desirable to evaluate the ones count as quickly as possible. An obvious method to one skilled in the art is to place the binary vector in a register that is equal in length to the size of the vector, then shift the register to the right one bit at a time, incrementing a counting register by one each time the least significant bit (LSB) of the binary vector register is a one. This method has the primary disadvantage of being too slow, requiring N clock cycles per evaluation.

Another method in the prior art of counting the ones in a binary vector is to use a carry save adder circuit 40 as illustrated in FIG. 2C. The circuit is asynchronous and can effectively provide a ones count 42 for the binary input vector 41 within a single clock cycle. The carry save adder array is constructed from full adders (FIG. 2A) and half adders (FIG. 2B). The full adder 20 has three inputs A, B, C (21–23) and two outputs consisting of a sum S 24 and a carry Y 25. As shown in the truth table 26, the sum 24 is a one when the number of inputs (21–23) equal to one is odd. The carry 25 is a one when two or more of the inputs (21–23) are one. The half adder 30 has two inputs A 31 and C 32 and two outputs consisting of a sum S 33 and a carry Y 34. As shown in its truth table 35, the half adder's sum 33 is a one when the number of inputs 31, 32 is odd. The half adder's carry 34 is a one only when both inputs 31, 32 are ones.

FIG. 2C illustrates the operation of the carry save adder with the example of FIG. 1B where a 16-bit binary vector 41 (1, 0, 1, 1, 1, 1, 0, 1, 1, 1, 0, 1, 0, 1, 1, 0) is accepted as input to the carry save adder to produce a ones count 42 of $01011_2$. The organization of a carry save adder is that of summing trees (e.g., 50, 60, 70) formed of full adders and half adders as required. Within a single summing tree, the sum outputs (24 or 33) of each full adder or half adder are connected to the inputs (21–23 or 31, 32) of subsequent full adders 20 or half adders 30 until there is only a single adder component remaining (e.g., 58) with its sum and carry outputs. The carries (25 or 34) from the adder components above the final adder component are passed to a next summing tree (e.g., from 50 to 60) where they are similarly reduced to a single sum and carry. This is carried out until no further reduction can be achieved (for example, the summation tree 70 is composed only of a single half adder 71 that has no carries out of the summation tree, so it represents the final summation tree). The carries and sums from the summation trees are then added with a conventional two-input carry propagate adder 80 to produce the ones count output word 42 which is equal to the number of ones in the binary input vector 41.

In consideration of integrated circuits wherein regular structures and nonoverlapping interconnections are considered desirable, the use of carry save adder array 40 as a ones counter is disadvantageous due to its irregular structure consisting of separate two-dimensional summing planes 50 (composed of full adders 51–57 and half adder 58), 60 (composed of full adders 61–63), 70 (composed of the half adder 71) connected by a carry propagate adder 80 (composed of half adders 81, 83 and full adder 82). The connections of the carries between the summing planes (50 to 60 and 60 to 70) are effectively three dimensional and thus require that extra metallization layers be provided so that the interconnections can be routed over other interconnections.

It is therefore desirable to provide an asynchronous ones counter that is easily expandable to accept any size input vector wherein the structure is regular and the interconnections between the components are two-dimensional (as previously defined). The present invention achieves these goals.

SUMMARY OF THE INVENTION

Therefore, in view of the foregoing, the present invention provides an extensible method for constructing an asynchronous ones counter from like cells that are arranged in a regular pattern with a means of interconnection between the cells that is two-dimensional (as previously defined) so that none of the interconnections overlap.

The basis of operation of the present invention is illustrated in FIG. 1B wherein a binary vector of (1, 0, 1, 1, 1, 1, 0, 1, 1, 1, 0, 1, 0, 1, 1, 0) input to the ones counter produces a binary ones count output word of $01011_2$ indicating that there are eleven ones in the binary vector. It is a well known to those skilled in the art that an odd number (i.e., a decimal number ending in 1, 3, 5, 7, or 9) will have in its binary equivalent a least significant bit of 1 and this is readily illustrated in FIG. 1B where the ones count is eleven (an odd number) and the LSB of its binary equivalent is 1. From the standpoint of the present invention, the LSB of the ones count output word represents the odd/even sense of the number of groups of ones with a group size of one. Since there eleven groups of ones with a size of one and eleven is an odd number then the LSB of the ones count word will be a 1. In a similar manner, the next most significant bit of the ones count word represents the odd/even sense of the number of groups of ones with a group size of two. From FIG. 1B we can see that there are five groups of two ones within the binary vector. How the ones are grouped is immaterial (the example starts at the left of the binary vector, drawing a thick underline until the group size is satisfied whereupon a new underline is begun) and the fact that there may be leftover ones insufficient to form a full group is also immaterial. So, with respect to the bit adjacent to the LSB of the ones count word, there are five groups of two ones and thus five, being an odd number, implies that the bit should be a 1. Similarly, the sense of the next most significant bit in the output word is determined by the odd/even sense of the number of groups of four ones in the binary vector. There two groups of four ones and two, being an even number, implies that its associated bit in the output word should be a 0. Again, doubling the group size, we see that there is only one group of eight ones and one, being an odd number, implies that its associated bit should be a one. Since there are sixteen ones in the input binary vector, we also consider a group size of sixteen ones. There are zero groups of this size and zero, being an even number, implies that the most significant bit (MSB) of the ones count word should be a 0.

From the standpoint of the physical implementation of the present invention, the ones counter consists of an array of like cells with each row of the array dedicated to determining a single bit of the ones count output word. The first row of the array receives the binary vector containing the ones to be counted and it determines the LSB of the ones count output word. By exclusive-ORing all the bits of the binary vector, the odd/even sense of the count of groups of size one can be readily determined since each input line in the binary vector represents the state of a single group of size one. Additionally, the cells in the first row of the array must detect groups of size two and pass this information to the next row of the array in the form of a second binary vector (roughly one-half the size of the input binary vector) wherein each bit of the new binary vector represents the presence of a group of two ones. Thus the second row will determine the sense of the bit adjacent to the LSB in the ones count word. It, will in turn, pass on a third binary vector to the third row wherein each bit represents the presence pair of ones in the second binary vector which is effectively a group of four ones. In a manner similar to the first row, the bits are exclusive-ORed together to determine the odd/even sense of the number of groups and thus the 1/0 sense of the associated bit in the ones count output word. The binary vector size is reduced by half after each row in the array and the construction of the array is terminated when there is only one cell composing the row. This final cell will determine the MSB of the ones count word through the odd/even sense of its two inputs or, in the special case of a binary input vector equal in length to an integer power-of-two, through the pair detection signal normally passed to the subsequent row of the array.

It is readily apparent from the exemplary array shown in FIG. 4A and FIG. 4B that the array organization is inherently two-dimensional and that there are no overlapping connections between the basic cells in the array.

BRIEF DESCRIPTION OF THE DRAWINGS

FIG. 3A is a logic schematic of the basic cell used to implement the ones counter array.

FIG. 3B is the schematic symbol of the basic cell.

FIG. 3C is the truth table illustrating the function of the basic cell.

DETAILED DESCRIPTION OF THE INVENTION

The present invention is an asynchronous ones counter that is composed of an iterative, two dimensional array of like basic cells 100 where FIG. 3A–FIG. 3C illustrate the basic cell's schematic diagram, symbol, and truth table respectively. The basic cell 100 is designed to be an element in a row of similar cells such as illustrated by 201–208 in FIG. 4A. The purpose of the row in the cellular array is twofold: firstly, the row must determine the odd/even sense of the number of inputs that are a binary 1 from above the row (as typified by basic cell inputs B 102 and C 103) and output this information from the rightmost cell (basic cell output O 104); secondly, the row must compose an output binary vector wherein each 1 in the output binary vector is indicative of a pair of 1s in the input binary vector. The output binary vector is output (basic cell output P 105) from the bottom of the row so that it may be received as input by the subsequent row below.

Figure 4A:
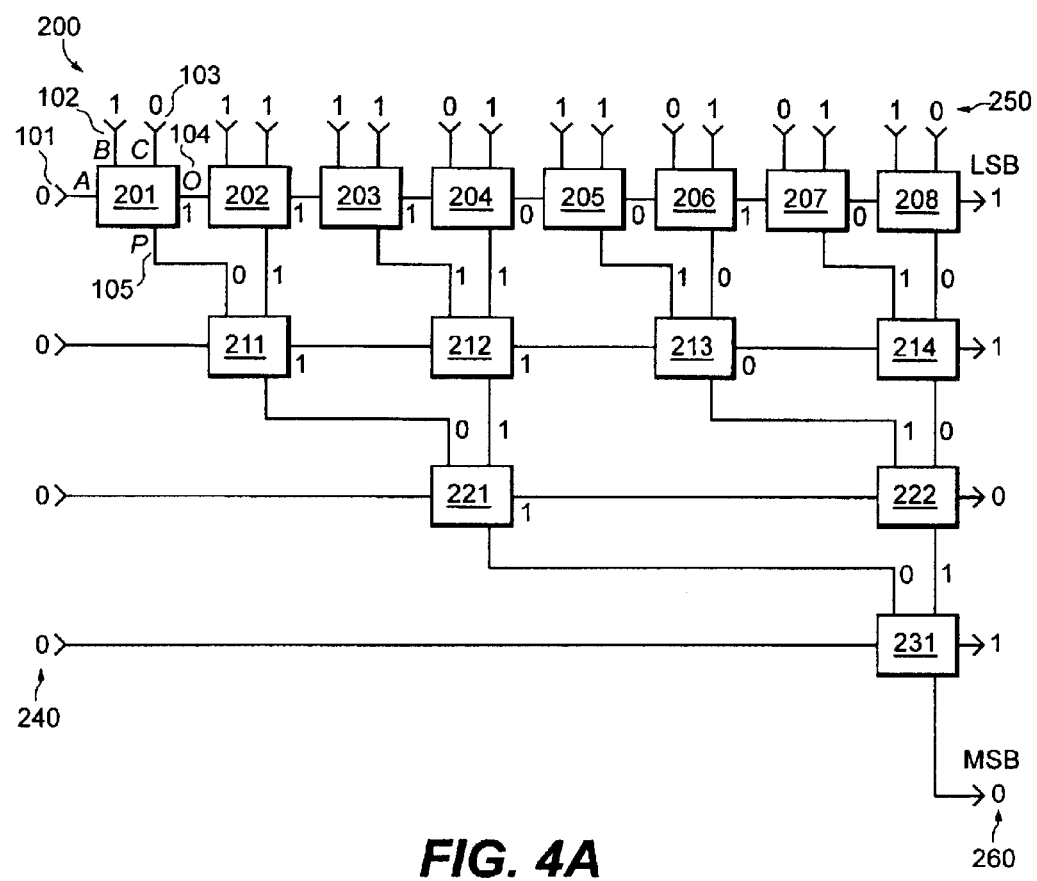
FIGS. 4A and 4B illustrate an exemplary array for a ones counter according to the present invention.

A row in the ones counter array may be composed of only a single cell such as 231 in FIG. 4A or more frequently, a plurality of cells such as 221–222, 211–214, or 201–208 also shown in FIG. 4A. Thus a basic cell must both provide the functionality required of a row (in the case of a single-cell row) and also provide the means to work in congress with one or more other cells in the case of a row composed of a plurality of cells.

Referring to basic cell logic schematic in FIG. 3A, the means of computing the odd/even sense of the input binary vector for either a single cell or a plurality of cells involves inputs A 101, B 102, C 103 and output O (abbreviation for "odd") 104. Inputs B 102 and C 103 (binary vector inputs) are connected to the inputs of exclusive-OR (henceforth referred to as "XOR") gate 106 whose output, along with basic cell input A 101 are connected to the inputs of XOR gate 108 whose output forms the basic cell output O 104. Those skilled in the art will recognize an XOR gate as having a binary 1 output when the aggregate of its inputs that are a binary 1 is an odd number (henceforth, inputs or outputs equal to a binary 1 may be referred to as "active"). Connecting a plurality of XOR gates together in either a chain-like or tree-like fashion will have the effect of producing a larger XOR gate that will retain the property of having an active output when the aggregate of its active inputs is an odd number. Thus XOR gates 106 and 108 form a composite XOR gate whose output O 104 is active when the total of active cell inputs A 101, B 102, C 103 is odd.

In the case of a single-cell row, basic cell inputs B 102, C 103 are connected to the binary input vector and input A 101 is connected to a binary 0 and output O 104 serves as the row output. In the case of a multiple-cell row, the leftmost cell will have its input A 101 connected to a binary 0 and any cell to the left of the rightmost cell will have its output O 104 connected to the input A 101 of the cell to its right, forming a chain connection of XOR gates whose composite output will be the output O 104 of the rightmost cell. Thus the output O 104 of the rightmost cell will, in either case, indicate the odd/even sense of the binary input vector (1 when odd and 0 when even).

The second function of the basic cell is to form a new binary vector to be output to the subsequent row below in which each bit in the new binary vector represents the occurrence of a pair of 1s in the input binary vector. The basic cell conveys this information through output P (abbreviation for "pair") 105. There are two ways in which a pair of 1s can be detected by the basic cell: firstly, if both the inputs B 102 and C 103 are 1, then the output of AND gate 107 will be a 1 and thus the output of OR gate 110, which forms cell output P 105, will be a 1; secondly, if only one of the inputs B 102 and C 103 is 1 and a similar condition exists to the left of the cell (indicated by an active cell input A 101) then the outputs of XOR gate 106, AND gate 109, and OR gate 110 (which forms cell output P 105) will all be 1.

Figures 2A, 2B, 2C:
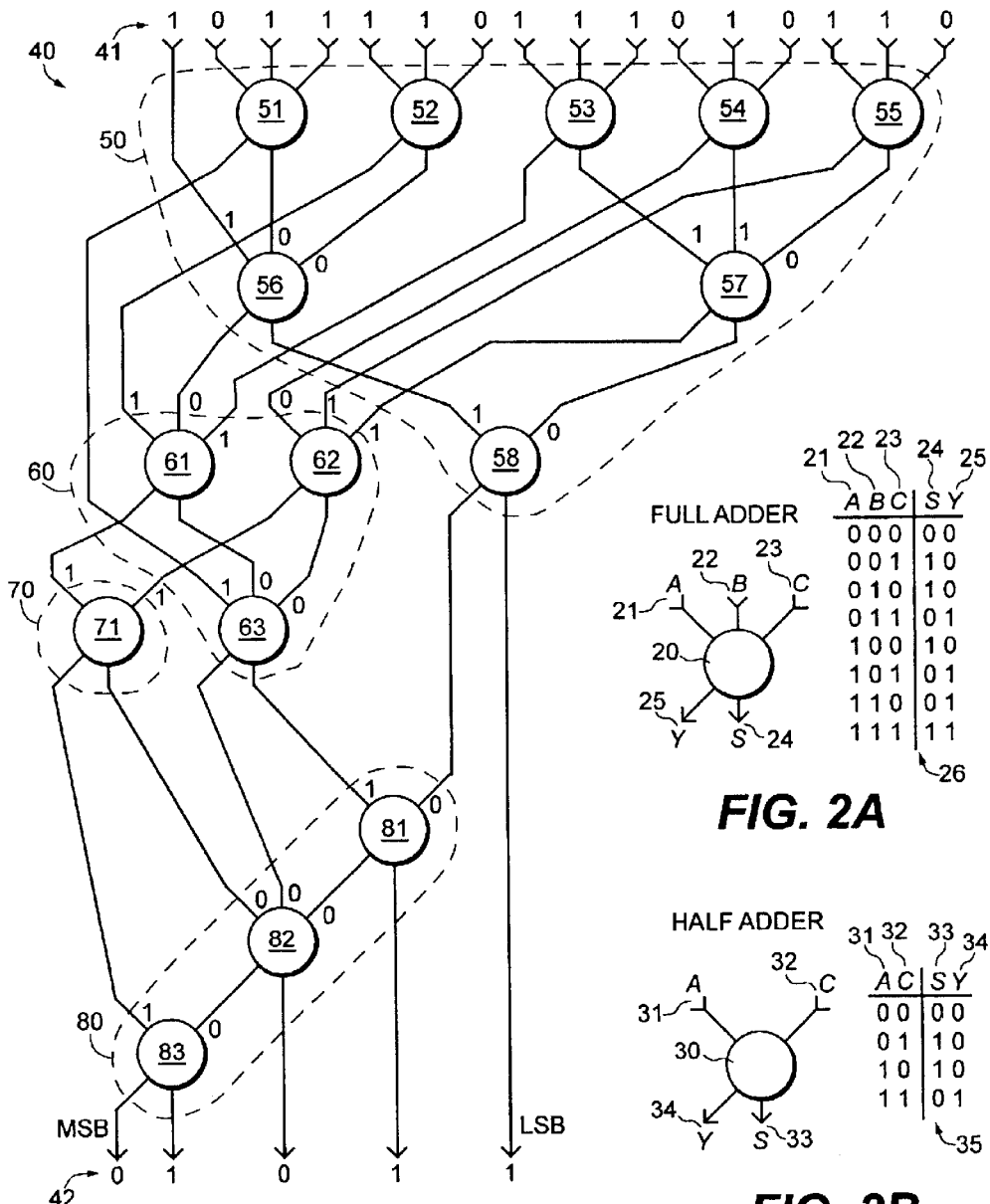
FIG. 2A shows a full adder cell and its truth table.
FIG. 2B shows a half adder cell and its truth table.
FIG. 2C illustrates the prior art in which a ones counter is implemented with an irregular array of full adder cells and half adder cells.
Figure 4B:
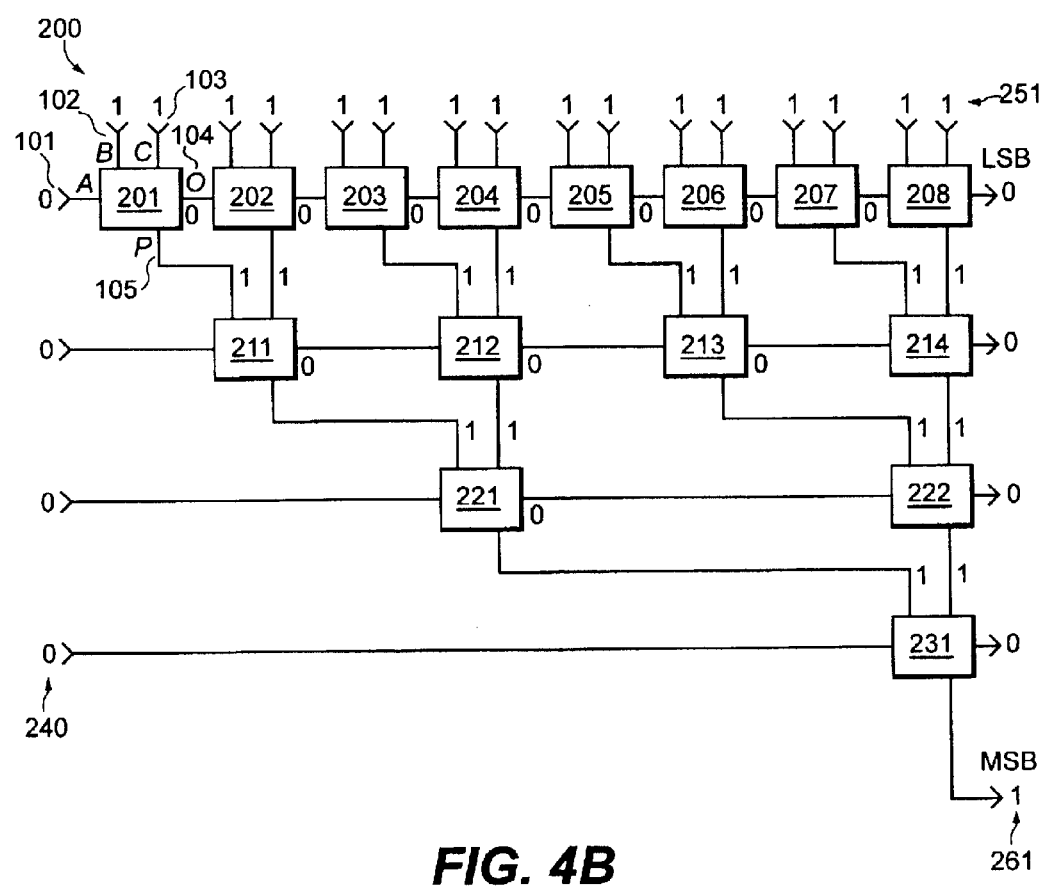

The schematic symbol of the basic cell 100 that is used to construct the exemplary arrays 200 in FIG. 4A and FIG. 4B is shown in FIG. 3B. The truth table 106 of the basic cell is shown in FIG. 3C. The truth table 106 of the basic cell 100 is equivalent to the truth table 26 of the full adder cell 20 shown in FIG. 2A wherein the odd output O 104 of the basic cell is equivalent to the sum output S 24 of the full adder cell and the basic cell's pair output P 105 is equivalent to the full adder cell's carry Y output 25. The full adder is a commonly available component found in many integrated circuit systems and it can readily be utilized as the basic cell in a ones counter array according to the present invention.

Figures 1A, 1B:
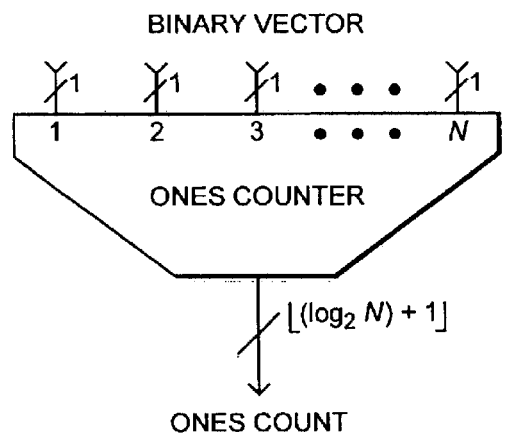
FIG. 1A illustrates the function of a ones counter.
FIG. 1B illustrates the underlying principle of the invention.

FIG. 4A illustrates an exemplary array 200 of basic cells 100 that implements a ones counter according to the present invention. The binary input vector (1, 0, 1, 1, 1, 1, 0, 1, 1, 1, 0, 1, 0, 1, 1, 0) 250 is the same as the example in FIG. 1B. The ones count binary output word $01011_2$ 260 indicates that there are eleven 1s in the binary input vector 250. Binary 0 inputs 240 are supplied to the A inputs 101 of all the leftmost basic cells in the array as previously described. The first row of the array is comprised of cells 201–208 with each cell's B and C inputs 102, 103 accepting two bits from the binary input vector 250 and with the O output 104 of cell 208 providing the LSB of the ones count output word 260. From the eight cells 201–208, a new binary vector (each bit indicating the presence of a pair of 1s in the first binary input vector) is composed from the P outputs 105 of each cell and passed to the second row which is comprised of cells 211–214.

The second row of the array 200 operates in a manner similar to the first row. The rightmost cell 214 provides the next most significant bit of the ones count output word 260 from its O output 104. The four cells 211–214 of the second row also provide a binary input vector to the third row of the array. Each bit in the new vector for the third row is indicative of the presence of two 1s in the second row's binary input vector. This is the equivalent of a group of four 1s in the first binary input vector.

The third row, comprised of cells 221–222, provides the next most significant bit of the ones count output word from cell 222 and provides a two-bit binary vector (each bit now indicating the presence of a group of eight 1s in the first binary vector) to the fourth row comprised of the single cell 231 whose O output 104 provides the next most significant bit of the ones count word 260 and whose P output 105 provides the ones count word MSB.

It is can be appreciated that the objectives of the present invention are readily met in that: the array is composed of like cells whose computation is asynchronous; the array is constructed in a regular manner and its construction is readily extensible to accept any length binary vector; the array construction is two-dimensional (as previously defined) and the connections between the basic cells are not required to overlap.

From the foregoing description and accompanying drawings, various modifications to the present invention will become apparent to those skilled in the art. Accordingly, the present invention is to be limited solely by the scope of the following claims.

What is claimed is:

1. A ones counter for assessing an input binary vector, consisting variously of ones and zeros, and outputting a binary ones count word indicative of the number of ones present in the binary vector, comprising:

a two-dimensional array of like cells, wherein the array is comprised of one or more rows of cells, each row being comprised of one or more cells with the interconnections between the cells being two-dimensional and non-overlapping; and cells having three single-bit inputs, a single-bit first output indicating that the number of active inputs is odd, and a single-bit second output indicating that at least two inputs are active.

2. The ones counter of claim 1 further comprising:

a first row in the array, consisting of a sufficient number of cells to accept the input binary vector, with bits from the binary vector being transmitted to second and third inputs of each cell with each cell's first output being connected to first input of the cell to its right with the rightmost cell's first output providing the least significant bit of the binary output ones count word and with the leftmost cell receiving a binary zero for its first input;

a first row in the array further comprising a subsequent binary vector indicative of the second output of each cell in the first row; and subsequent rows as necessary to receive subsequent binary vectors until a final row is constructed with its second output indicative of the most significant bit of the binary output ones count word and its first output indicative of the next most significant bit of the binary output ones count word.

3. The ones counter of claim 1 wherein each cell is comprised of a full adder having three inputs, a sum output, and a carry output, wherein:

the full adder's inputs comprise each cell's inputs;

the full adder's sum output comprises each cell's first output; and the full adder's carry output comprises each cell's second output.

* * * * *